(12) United States Patent
Kume

(10) Patent No.: US 8,530,816 B2
(45) Date of Patent: Sep. 10, 2013

(54) PHOTOELECTRIC CONVERSION DEVICE HAVING A CORRECTION UNIT TO CORRECT OUTPUT OF AN ANALOG-TO-DIGITAL CONVERTER

(75) Inventor: Atsuko Kume, Sagamihara (JP)

(73) Assignee: Olympus Corporation, Tokyo (JP)

( * ) Notice: Subject to any disclaimer, the term of this patent is extended or adjusted under 35 U.S.C. 154(b) by 144 days.

(21) Appl. No.: 13/178,200

(22) Filed: Jul. 7, 2011

(65) Prior Publication Data

US 2011/0290985 A1     Dec. 1, 2011

Related U.S. Application Data

(63) Continuation of application No. PCT/JP2010/050106, filed on Jan. 7, 2010.

(30) Foreign Application Priority Data

Jan. 9, 2009    (JP) ................................ P2009-003710

(51) Int. Cl.
     *H01L 27/00*      (2006.01)
(52) U.S. Cl.
     USPC ...................................................... 250/208.1
(58) Field of Classification Search
     USPC .................. 348/308, 294; 250/208.1, 214.1; 341/126–172
See application file for complete search history.

(56) References Cited

U.S. PATENT DOCUMENTS

| 6,861,969 B1 * | 3/2005 | Ali ................................ 341/161 |
| 2006/0243885 A1 | 11/2006 | Watanabe |

FOREIGN PATENT DOCUMENTS

| JP | 11-230843 A | | 8/1999 |
| JP | 11230843 A | * | 8/1999 |
| JP | 2001-324390 A | | 11/2001 |
| JP | 2006-287879 A | | 10/2006 |

OTHER PUBLICATIONS

International Search Report for PCT/JP2010/050106, mailing date of Feb. 9, 2010.

* cited by examiner

*Primary Examiner* — Thanh Luu
*Assistant Examiner* — Renee Naphas
(74) *Attorney, Agent, or Firm* — Westerman, Hattori, Daniels & Adrian, LLP

(57) ABSTRACT

A photoelectric conversion device may include a pixel array including a plurality of two-dimensionally arranged pixels, and a plurality of analog-to-digital converters (ADCs). Each ADC may include a pulse delay circuit including a plurality of connected delay unit stages, each of which delays a pulse signal during a delay time corresponding to a magnitude of a voltage of the pixel signal read from the pixel array, an encoder unit that outputs a digital value based on the number of stages of the delay units through which the pulse signal has passed during a predetermined time, and a correction unit that corrects the digital value output by the encoder unit by a rate corresponding to the number of stages of the delay units through which the pulse signal has passed during a predetermined period.

6 Claims, 12 Drawing Sheets

PHOTOELECTRIC CONVERSION DEVICE HAVING A CORRECTION UNIT TO CORRECT OUTPUT OF AN ANALOG-TO-DIGITAL CONVERTER

CROSS REFERENCE TO RELATED APPLICATIONS

This application is a continuation application based on a PCT Patent Application No. PCT/JP2010/050106, filed Jan. 7, 2010, whose priority is claimed on Japanese Patent Application No. 2009-003710 filed Jan. 9, 2009, the entire content of which are hereby incorporated by reference.

BACKGROUND OF THE INVENTION

1. Field of the Invention

The present invention relates to a photoelectric conversion device for use in a digital camera, a digital video camera, an endoscope, or the like.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

In the related art, solid-state imaging devices are used as photoelectric conversion devices of digital cameras, digital video cameras, endoscopes, and the like. Efforts to reduce size and power consumption of digital cameras, digital video cameras, endoscopes, and the like equipped with the solid-state imaging devices are ongoing. Based on this, size reduction and low power consumption of the solid-state imaging devices are necessary.

For the size reduction and low power consumption of the solid-state imaging device, a solid-state imaging device having a built-in analog-to-digital converter (ADC) constituted by a digital circuit has been proposed (see Japanese Unexamined Patent Application, First Publication No. 2006-287879).

FIG. 11 is a block diagram illustrating a schematic configuration of a solid-state imaging device in accordance with the related art. As shown in FIG. 11, the solid-state imaging device includes a plurality of array blocks (sub-arrays) B1, B2, ... two-dimensionally arranged in 4 rows and 5 columns in FIG. 11, wherein each array block includes a pixel block 90 in which photoelectric conversion elements, each of which outputs a pixel signal corresponding to an incident light amount, are two-dimensionally arranged in an array and an ADC 91 that performs an analog-to-digital conversion on the pixel signal output from a pixel of the pixel block 90.

FIG. 12 is a block diagram illustrating an example of a circuit configuration of the ADC 91 provided in each array block (sub-array) of FIG. 11. In the ADC 91 shown in FIG. 12, a delay circuit 911 is constituted by a plurality of delay units including various gate circuits (for example, a negative AND (NAND) gate and a plurality of inverter (INV) gates) connected in a ring shape. An input signal (voltage) serving as an analog-to-digital conversion target is supplied as a power supply voltage of each delay unit. If an input pulse signal φPL is input to the delay circuit 911, the input pulse signal φPL having a delay time corresponding to the above-described power supply voltage sequentially passes through the delay units, and circulates within the delay circuit 911. The number of stages of delay units through which the input pulse signal φPL has passed is determined by a delay time of the delay units, that is, the input signal supplied as the power supply voltage. The number of delay unit passage stages (and the number of circulations) is detected by an encoder 912.

The encoder 912 includes a counter circuit 9121, which counts the number of circulations of the input pulse signal φPL circulating within the delay circuit 911, a latch and encoder circuit 9122, which detects the number of stages through which the input pulse signal φPL travels within the delay circuit 911, and an adder 9123, which adds an output of the counter circuit 9121 to an output of the latch and encoder circuit 9122. An output value of the adder 9123 becomes a digital value after an analog-to-digital conversion corresponding to a voltage of the input signal. In the solid-state imaging device of FIG. 11, a pixel signal is input as the input signal and a digital value corresponding to an incident light amount is output.

There are a period in which an analog-to-digital conversion of a pixel signal corresponding to an incident light amount output from a photoelectric conversion element is performed, that is, an imaging period, and a period in which the analog-to-digital conversion is stopped in control of the solid-state imaging device used as the photoelectric conversion device in the digital camera, the digital video camera, the endoscope, or the like. The analog-to-digital conversion is stopped, that is, the operation of the ADC is disabled, so that power consumption of the solid-state imaging device is reduced and power consumption of the digital camera, the digital video camera, the endoscope, or the like equipped with the solid-state imaging device is further reduced.

It is possible to stop the circulation of the input pulse signal φPL within the delay circuit 911 by setting the input signal pulse φPL to a "Low" level in the ADC 91 shown in FIG. 12.

However, if the ADC is operated by setting the input pulse signal φPL, to a "High" level from a state in which the ADC is stopped by setting the input pulse signal φPL to the "Low" level in the solid-state imaging devices of the related art including the solid-state imaging device of Patent Document 1, there is a period in which a circulation time of the input pulse signal φPL within the delay circuit 911 is unstable after the ADC is operated. Thereby, a digital value to be output is unstable and noise is included in the digital value.

FIG. 13 is a graph illustrating an example of a relationship between a circulation time in which the input pulse signal φPL circulates within the delay circuit 911 from an operation start time of the ADC and the number of circulations. In FIG. 13, a circulation time in which the input pulse signal φPL circulates within the delay circuit 911 within the number of circulations, 5, is not stable.

SUMMARY

The present invention provides a photoelectric conversion device capable of obtaining a good digital value by correcting a digital value of a period in which the digital value output after an operation start of an ADC is unstable in the photoelectric conversion device including the ADC that circulates an input pulse signal by a delay time corresponding to an incident light amount of a photoelectric conversion element and outputs a digital value corresponding to the number of circulations of the input pulse signal.

A photoelectric conversion device may include a pixel array including a plurality of two-dimensionally arranged pixels, each of which has a photoelectric conversion element and outputs a pixel signal corresponding to an amount of light incident on the photoelectric conversion element, and a plurality of analog-to-digital converters (ADCs), each of which converts the pixel signal read from the pixel array into a digital value and outputs the digital value. Each ADC may include a pulse delay circuit including a plurality of connected delay unit stages, each of which delays a pulse signal during a delay time corresponding to a magnitude of a voltage of the pixel signal read from the pixel array, an encoder unit that outputs a digital value based on the number of stages of the delay units through which the pulse signal has passed during a predetermined time, and a correction unit that corrects the digital value output by the encoder unit by a rate corresponding to the number of stages of the delay units through which the pulse signal has passed during a predetermined period.

The correction unit may invalidate a digital value corresponding to the number of stages of the delay units through which the pulse signal has passed until a predetermined period has elapsed after the pixel signal has started to be read from the pixel array.

The correction unit may include a subtraction unit that subtracts a predetermined value from the digital value output from the encoder unit.

The correction unit may include an arithmetic unit that calculates a subtraction value according to the digital value output from the encoder unit, and a subtraction unit that subtracts the subtraction value calculated by the arithmetic unit from the digital value output from the encoder unit.

The correction unit may include a storage unit that stores a digital value corresponding to the number of stages of the delay units through which the pulse signal has passed until a predetermined period has elapsed after the pixel signal has started to be read from the pixel array, and a subtraction unit that subtracts the digital value stored by the storage unit from the digital value output from the encoder unit.

According to the present invention, it is possible to obtain a good digital value by performing an analog-to-digital conversion on a pixel signal corresponding to an incident light amount of a photoelectric conversion element because noise included in a digital value of a period in which an operation of an ADC is unstable can be reduced by correcting the digital value of the period in which the digital value output after an operation start of the ADC provided in a photoelectric conversion device is unstable.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will be now described herein with reference to illustrative embodiments. Those skilled in the art will recognize that many alternative embodiments can be accomplished using the teaching of the present invention and that the present invention is not limited to the embodiments illustrated for explanatory purpose.

Figure 1:
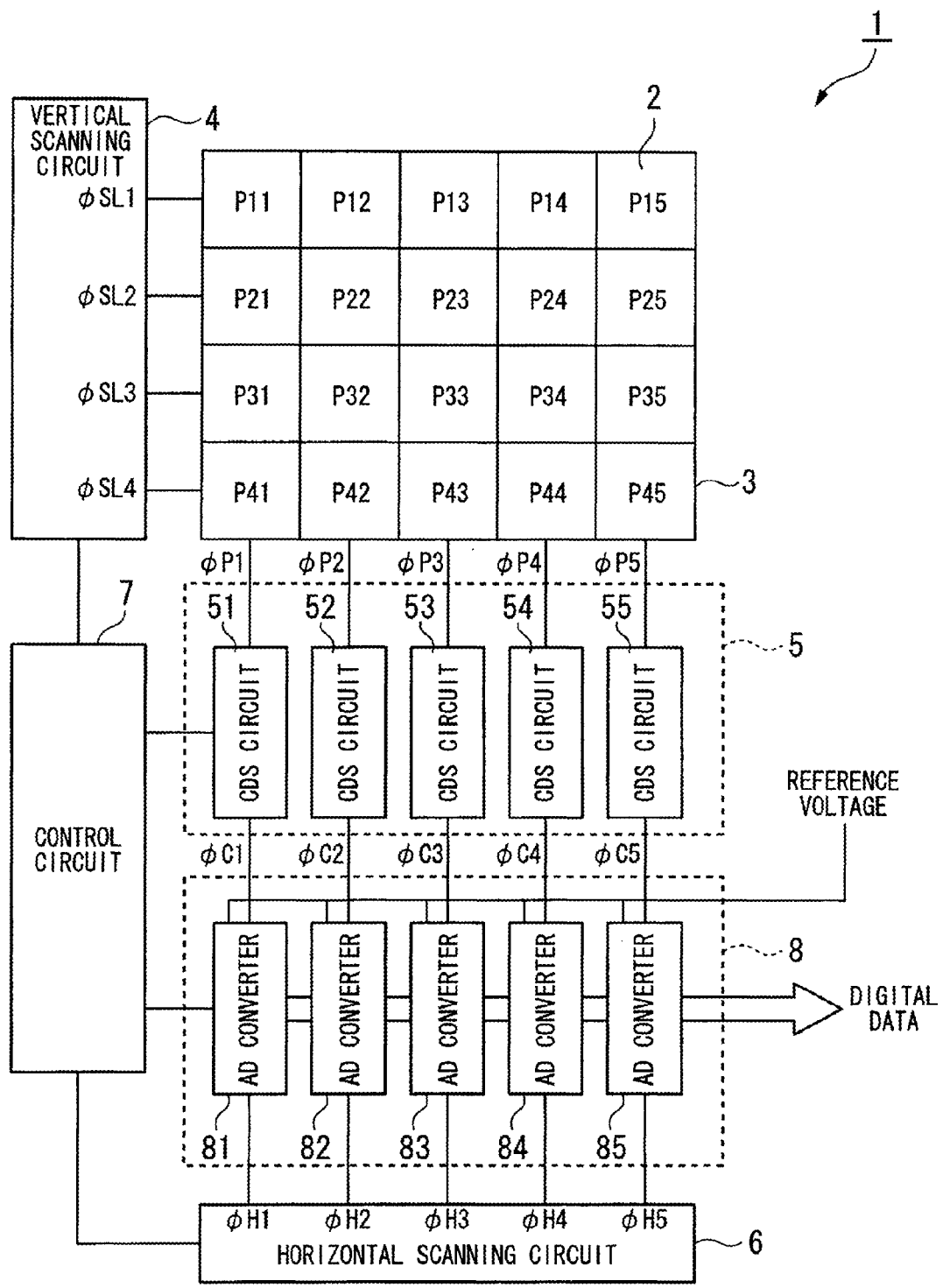
FIG. 1 is a block diagram illustrating a schematic configuration of a photoelectric conversion device in accordance with embodiments of the present invention.

FIG. 1 is a block diagram illustrating a schematic configuration of a photoelectric conversion device in accordance with embodiments of the present invention. In FIG. 1, a photoelectric conversion device 1 includes pixels P11 to P45, a vertical scanning circuit 4, correlated double sampler (CDS) circuits 51 to 55 (hereinafter referred to as CDSs 51 to 55), a horizontal scanning circuit 6, a control circuit 7, and AD converters 81 to 85 (hereinafter referred to as ADCs 81 to 85). In FIG. 1, the pixels P11 to P45 are two-dimensionally arranged in 4 rows and 5 columns, and are constituted as a pixel array 3. Any one of the pixels P11 to P45 is referred to as a "pixel 2." A group of the CDSs 51 to 55 is referred to as a "CDS 5." A group of the ADCs 81 to 85 is referred to as an "ADC 8."

The pixels P11 to P45 are photoelectric conversion elements. Each of the pixels P11 to P45 outputs a pixel output signal having a level corresponding to an incident light amount if its own pixel 2 is selected by the vertical scanning circuit 4. The pixels P11 to P45 are two-dimensionally arranged in the 4 rows and the 5 columns as the pixel array 3, and output pixel output signals φP1 to φP5 for the pixel columns. The first number subsequent to "pixel P" shown in the pixels P11 to P45 is a row number and the last number is a column number.

The CDSs 51 to 55 arranged in the pixel columns of the pixel array 3 output differences between pixel output signals read from the pixels 2 and a pixel reset signal to the ADCs 81 to 85 as pixel signals φC1 to φC5 corresponding to image data when the pixels 2 are exposed. A number subsequent to "CDS 5" shown in the CDS 51 to the CDS 55 is a column number of the pixel array 3.

The ADCs 81 to 85 perform analog-to-digital conversions on the pixel signals φC1 to φC5 input from the CDSs 51 to 55. The ADCs 81 to 85 perform the analog-to-digital conversions on the input pixel signals, and output digital values after the conversions. A number subsequent to "ADC 8" shown in the ADC 81 to the ADC 85 is a column number of the pixel array 3.

The vertical scanning circuit 4 selects a row of the pixel 2 to be read from the pixel array 3 in response to a vertical control signal input from the control circuit 7. The vertical scanning circuit 4 outputs row selection signals φSL1 to φSL4 corresponding to rows of the pixels 2 to be read from the pixel array 3. For example, if the first row of the pixel array 3 is selected, the vertical scanning circuit 4 outputs the row selection signal φSL1 having a selection level (for example, the "High" level) to the pixel array 3, and outputs the other row selection signals φSL2 to φSL4 having a non-selection level (for example, the "Low" level), which correspond to the non-selected rows, to the pixel array 3.

The horizontal scanning circuit 6 generates an output of the photoelectric conversion device by causing the ADCs 81 to 85 to output digital values into which analog-to-digital conversions are performed for the columns in response to a horizontal control signal input from the control circuit 7. The horizontal scanning circuit 6 outputs column selection signals φH1 to φH5 corresponding to columns of digital values to be read from the ADC 8 to the ADC 8. For example, if a digital value of the first column of the pixel array 3 is output, the horizontal scanning circuit 6 outputs a column selection signal φH1 having an output approval level (for example, the "High" level) to the ADC 8, and outputs the other column selection signals φH2 to φH5 having an output disapproval level (for example, the "Low" level), which correspond to the columns whose digital values are not output, to the ADC 8. Subsequently, the column selection signals φH2 to φH5 sequentially having the output approval level (for example, the "High" level) and the other column selection signals φH1 to φH5 having the output disapproval level (for example, the "Low" level), which correspond to the columns whose digital values are not output, are output to the ADC 8, so that digital values into which the analog-to-digital conversions are performed by the ADC 8 are sequentially output.

The control circuit 7 controls the entire photoelectric conversion device. In response to an image acquisition command from an outside (not shown), the control circuit 7 outputs a vertical control signal, which controls the vertical scanning circuit 4, and a horizontal control signal, which controls the horizontal scanning circuit 6.

The control circuit 7 controls the operations (operation start and stop) of the CDS 5 and the ADC 8.

First Preferred Embodiment

Figure 2:
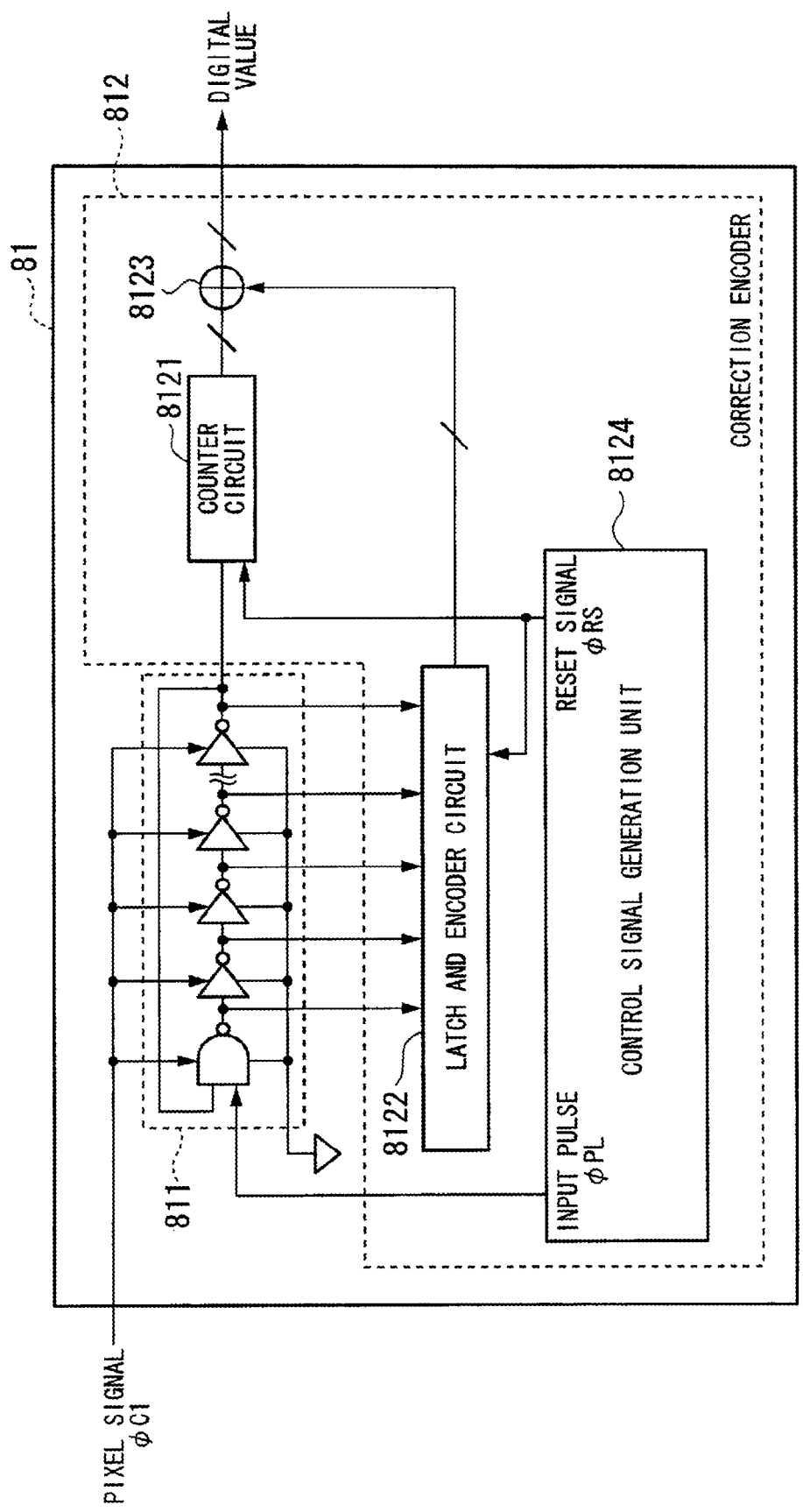
FIG. 2 is a block diagram illustrating a schematic configuration of an ADC provided in the photoelectric conversion device in accordance with a first preferred embodiment of the present invention.

Next, the ADCs of the photoelectric conversion device 1 in accordance with a first preferred embodiment of the present invention will be described. FIG. 2 is a block diagram illustrating a schematic configuration of one ADC (ADC 81) among the ADCs provided in the photoelectric conversion device 1 in accordance with the first preferred embodiment of the present invention. The other ADCs 82 to 85 are the same as the ADC 81 shown in FIG. 2. In FIG. 2, the ADC 81 includes a delay circuit 811 and a correction encoder 812. The correction encoder 812 includes a counter circuit 8121, a latch and encoder circuit 8122, an adder 8123, and a control signal generation unit 8124.

The ADC 81 performs an analog-to-digital conversion on a pixel signal φC1 input from the CDS 51 in response to a timing signal of analog-to-digital conversion start (not shown). A digital value is retained in an output control circuit (not shown) within the ADC 81 in response to a timing signal of analog-to-digital conversion completion (not shown). The digital value retained in the output control circuit (not shown) is output in response to the column selection signal φH1 input from the horizontal scanning circuit 6.

The delay circuit 811 has a plurality of gate circuits (hereinafter referred to as delay units) having a delay amount corresponding to a power supply voltage connected in a ring shape, and is a ring delay line (RDL), which circulates an input pulse φPL.

For example, if a first-stage delay unit is constituted by a NAND circuit (NAND gate) and the other delay units are constituted by NOT circuits (NOT gates), the input pulse φPL is input to one input terminal of the first-stage NAND gate, an output of a last-stage NOT gate is input to the other input terminal, and the output of the last NOT gate is logically inverted constantly when the delay circuit 811 does not operate. Each of the second and subsequent NOT gates logically inverts a value input to an input terminal and outputs the inverted value to an output terminal.

An input signal serving as a power supply voltage, that is, the pixel signal φC1 input from the CDS 51 serving as an analog-to-digital conversion target, is input to the delay unit of the delay circuit 811. Each delay unit outputs the input pulse φPL input from a previous-stage delay unit to a next-stage delay unit with a delay time corresponding to a level difference between a voltage level of the power supply voltage (pixel signal φC1) and a reference voltage (ground (GND) level in FIG. 2). The delay units connected in the ring shape identically operate and the input pulse φPL is transferred in sequence from a front-stage delay unit to a rear-stage delay unit, so that the input pulse φPL circulates within the delay circuit 811.

The correction encoder 812 is a circuit that detects the number of stages of delay units through which the input pulse φPL has passed within the delay circuit 811, and outputs the number of passage stages as a digital value, which is a result of analog-to-digital conversion by the ADC 81.

The correction encoder 812 initializes an unstable digital value, which is output in a period in which a circulation time of the input pulse φPL that circulates within the delay circuit 811 is unstable after the operation start of the ADC 81 (hereinafter, the period in which the circulation time of the input pulse φPL that circulates within the delay circuit 811 is unstable is referred to as an "unstable pulse period"). Thereby, a result of analog-to-digital conversion in the unstable pulse period is invalidated, and a digital value of the analog-to-digital conversion result to be output by the ADC 81 is corrected.

A digital value output from the correction encoder 812 is retained in an output control circuit (not shown) within the ADC 81 in response to a timing signal of analog-to-digital conversion completion (not shown).

The counter circuit 8121 detects the number of circulations of the input pulse φPL circulating within the delay circuit 811 and outputs the detected number of circulations (a count value).

The counter circuit 8121 adds 1 to the count value every time the input pulse φPL passes through the last stage of the delay circuit 811, and outputs the count value.

The counter circuit 8121 temporarily retains the number of circulations of the input pulse φPL circulating within the delay circuit 811, for example, at the rising timing of a reset signal φRS, and then initializes the temporarily retained number of circulations of the input pulse φPL circulating within the delay circuit 811 when an input level (for example, a "High" level) of the reset signal φRS has been retained for a predetermined period.

The latch and encoder circuit 8122 detects the number of stages of delay units through which the input pulse φPL has passed within the delay circuit 811, and outputs the detected number of passage stages.

The latch and encoder circuit 8122 temporarily retains values of the delay units within the delay circuit 811 in which the input pulse φPL circulates, for example, at the rising timing of the reset signal φRS, and outputs the temporarily retained values of the delay units within the delay circuit 811.

The adder 8123 is a circuit that processes the number of circulations input from the counter circuit 8121 and the number of passage stages input from the latch and encoder circuit 8122, and outputs a digital value corresponding to an input signal, that is, the pixel signal φC1 input from the CDS 51 serving as an analog-to-digital conversion target, as a result of analog-to-digital conversion performed by the ADC 81.

The adder 8123 processes the number of circulations input from the counter circuit 8121 as more significant bits of the digital value output by the ADC 81 and processes the number of passage stages input from the latch and encoder circuit 8122 as less significant bits of the digital value output by the ADC 81.

In the present invention, a position of bits to which the number of circulations input from the counter circuit 8121 and the number of passage stages input from the latch and encoder circuit 8122 are changed in the digital value as the result of analog-to-digital conversion performed by the ADC 81, that is, a processing method for performing a conversion into a final digital value, is not specified.

The control signal generation unit 8124 is a circuit that generates control signals to be input to the delay circuit 811, the counter circuit 8121, and the latch and encoder circuit 8122 so as to correct a digital value to be output by the ADC 81.

If the timing signal of analog-to-digital conversion start (not shown) is in an analog-to-digital conversion start state, the control signal generation unit 8124 sets the input pulse φPL to circulate within the delay circuit 811 to the "High" level, and causes the input pulse φPL to circulate within the delay circuit 811 during a delay time corresponding to the pixel signal φC1 input from the CDS 51. If the timing signal of analog-to-digital conversion completion (not shown) is in an analog-to-digital conversion completion state, the control signal generation unit 8124 stops the circulation within the delay circuit 811 by setting the input pulse φPL to circulate within the delay circuit 811 to the "Low" level.

The control signal generation unit 8124 outputs a reset signal ORS for initializing (invalidating) the counter circuit 8121 during an unstable pulse period (for example, a pulse having the "High" level during a predetermined period). When an analog-to-digital conversion period ends, the rising timing of the reset signal φRS output by the control signal generation unit 8124 is also used as a timing signal for temporarily retaining the number of circulations of the input pulse φPL circulating within the delay circuit 811 by the counter circuit 8121 and a timing signal for temporarily retaining a value of each delay unit within the delay circuit 811 in which the input pulse φPL circulates by the latch and encoder circuit 8122.

Figure 3:
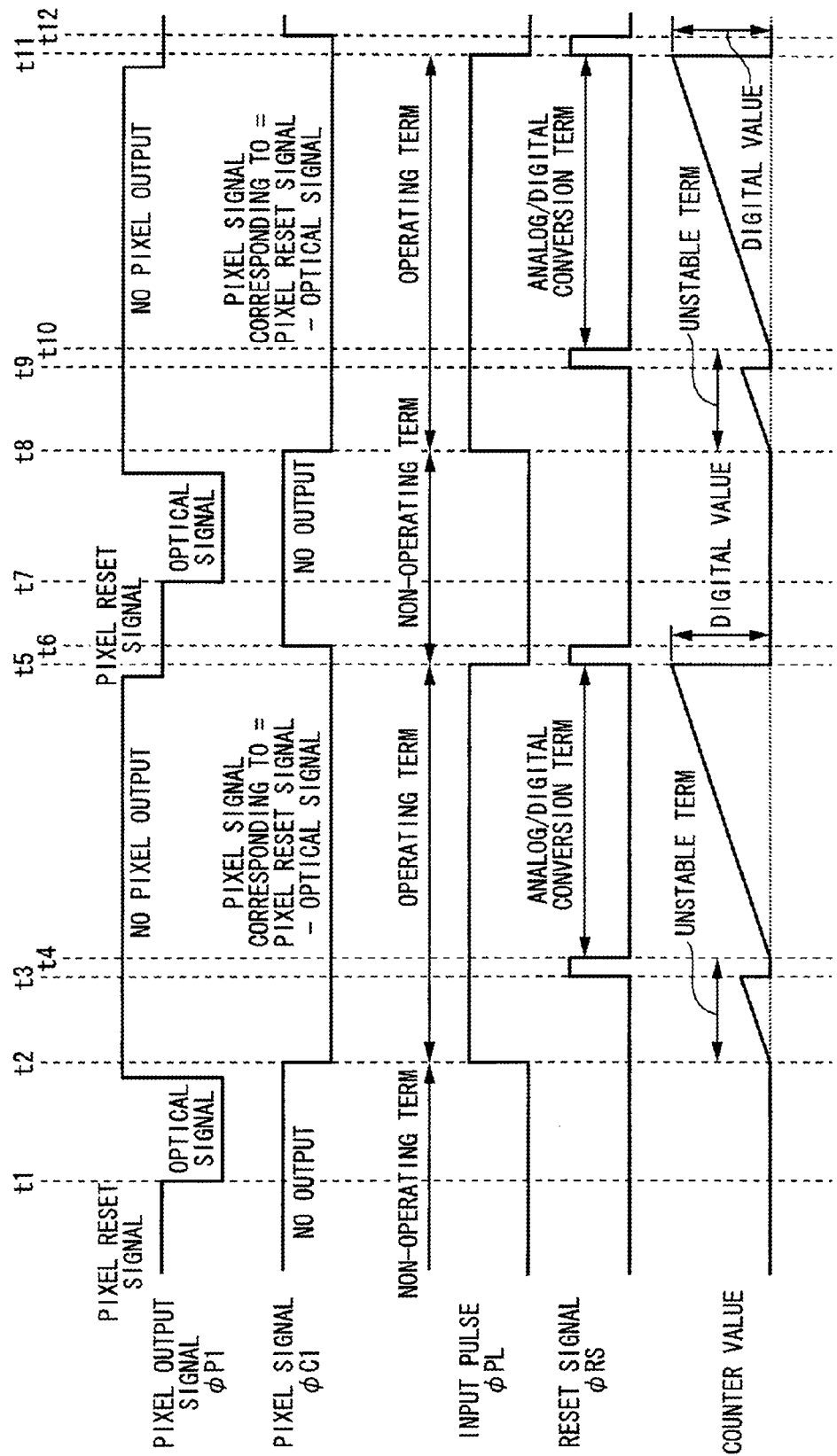
FIG. 3 is a timing chart illustrating an overview of an operation of the photoelectric conversion device in accordance with the first preferred embodiment of the present invention.

Next, the timing when a digital value of an image signal is output in the photoelectric conversion device 1 in accordance with the first preferred embodiment of the present invention will be described. FIG. 3 is a timing chart illustrating the overview of an operation of the photoelectric conversion device 1 in accordance with the first preferred embodiment of the present invention. In this description, an example of acquiring digital values of the pixels P11 and P21 of the first column of the pixel array 3 into which the ADC 81 performs analog-to-digital conversions will be described. The timings of the other ADCs 82 to 85 are the same as that of the ADC 81 shown in FIG. 3.

In FIG. 3, the photoelectric conversion device 1 is initialized from an outside (not shown), the pixel output signal φP1 has a voltage level of a reset state of the pixel P11 and the pixel signal φC1 has a voltage level indicating that there is no output. The input pulse φPL and the reset signal φRS have initial values ("Low" levels), and the counter value is "0."

Thereafter, the pixel array 3 is exposed if an image acquisition command is input from the outside (not shown).

Subsequently, at timing t1, the control circuit 7 outputs a vertical control signal for selecting the pixel P11 to the vertical scanning circuit 4, and the pixel P11 selected by the row selection signal φSL input from the vertical scanning circuit 4 outputs the pixel output signal φPL corresponding to an incident light amount. Because the input pulse φPL is at the "Low" level, the delay circuit 811 is in a non-operation (standby) state.

Subsequently, at timing t2, the CDS 51 outputs the pixel signal φC1 to the ADC 81 in response to the pixel output signal φP1 input from the pixel 11 and a pixel reset signal.

If the control signal generation unit 8124 sets the input pulse φPL to circulate within the delay circuit 811 to the "High" level, the input pulse φPL circulates within the delay circuit 811 during a delay time corresponding to a level difference between a voltage level of the pixel signal φC1 input from the CDS 51 and the reference voltage (for example, the GND level in FIG. 2). The counter circuit 8121 and the latch and encoder circuit 8122 start to detect each delay unit within the delay circuit 811. A result of delay unit detection started at timing t2 corresponds to the unstable pulse period.

Subsequently, at timing t3, the control signal generation unit 8124 initializes (invalidates) the detection result of the counter circuit 8121 by setting the reset signal φRS to the "High" level.

Subsequently, if a predetermined period, that is, the unstable pulse period, ends, the control signal generation unit 8124 releases the initialization of detection results of the counter circuit 8121 and the latch and encoder circuit 8122 by setting the reset signal φRS to the "Low" level at timing t4. Thereby, the counter circuit 8121 and the latch and encoder circuit 8122 re-start detection of each delay unit within the delay circuit 811.

Because the input pulse φPL also has the "High" level in a period from timing t2 to timing t4, the circulation within the delay circuit 811 is continued. The input pulse φPL continuously circulates within the delay circuit 811 until timing t4, so that the circulation period of the input pulse φPL is stable.

Thereby, the counter circuit 8121 and the latch and encoder circuit 8122 can detect a period in which the circulation period of the input pulse φPL is stable, and thus correct a digital value to be output by the ADC 81.

Subsequently, at timing t5, the analog-to-digital conversion period ends, and the circulation within the delay circuit 811 of the input pulse φPL is stopped if the control signal generation unit 8124 sets the input pulse φPL to the "Low" level. The control signal generation unit 8124 sets the reset signal φRS to the "High" level. At the rising timing of the reset signal φRS, the number of circulations of the input pulse φPL circulating within the delay circuit 811 detected by the counter circuit 8121 and the number of stages of delay units through which the input pulse φPL has passed within the delay circuit 811 detected by the latch and encoder circuit 8122 are temporarily retained. Thereafter, the adder 8123 processes the temporarily retained number of circulations and the number of passage stages, and outputs a digital value corresponding to an incident light amount of the pixel P11.

The output digital value is retained in the output control circuit (not shown) within the ADC 81. Thereafter, if the ADC 81 is selected by the column selection signal φH1 input from the horizontal scanning circuit 6, the digital value retained in the output control circuit (not shown) within the ADC 81, that is, the digital value corresponding to the incident light amount of the pixel P11, is output as an analog-to-digital conversion result.

Subsequently, at timing t6, the analog-to-digital conversion result for the pixel P11 is initialized.

Subsequently, at timing t7, the control circuit 7 outputs a vertical control signal for selecting the pixel P21 to the vertical scanning circuit 4, and the pixel P21 selected by the row selection signal φSL2 input from the vertical scanning circuit 4 outputs a pixel output signal φP1 corresponding to the incident light amount.

Thereafter, as in timings t2 to t6 described above, a digital value corresponding to the incident light amount of the pixel P21 is output as an analog-to-digital conversion result if the ADC 81 performs the analog-to-digital conversion for the pixel P21 and the ADC 81 is selected by the column selection signal φH1 input from the horizontal scanning circuit 6.

Thereafter, as in timings t1 to t6 described above, the ADC 81 outputs digital values corresponding to incident light amounts of the pixels P31 and P41 as analog-to-digital conversion results, and the analog-to-digital conversion for the pixel array 3, that is, the reading of all image signals of the photoelectric conversion device 1, is completed.

According to the first preferred embodiment of the present invention as described above, it is possible to obtain good image data (a digital value) in which noise appearing in an output image is reduced because an unstable digital value to be output in an unstable pulse period can be corrected when an analog-to-digital conversion into a digital value corresponding to an incident light amount of a pixel P is performed.

In particular, it is possible to make an effect by a correction of a digital value according to the present invention and obtain a good digital value in which noise of an obtained output signal is reduced because an ADC may be usually operated from the non-operation state in the ADC of low power consumption mounted in a digital camera, a digital video camera, or the like that operate with a cell or battery (for example, adaptation to signal processing of an imager).

An example in which the ADCs 81 to 85 corresponding to incident light amounts of the pixel array 3 two-dimensionally arranged in 4 rows and 5 columns are arranged has been described in the first preferred embodiment of the present invention, but the present invention can be adaptive to an ADC that performs an analog-to-digital conversion on an output of a linear sensor in which a plurality of pixels are configured in one column.

An example in which the CDS 5 is arranged between the pixel array 3 and the ADC 8 has been described in the first preferred embodiment of the present invention, but the CDS 5 may not be arranged. Likewise, it is possible to perform the analog-to-digital conversion if a pixel signal corresponding to a difference between a pixel reset signal of a pixel output signal and an optical signal is input to the ADC 8.

An example in which the reset signal φRS having an initial value between timing t2 and timing t3 is maintained at the "Low" level has been described in this embodiment, but the reset signal φRS may have the "High" level between timing t2 and timing t3, that is, timing t2 to timing t4 may be set to a reset period of the counter circuit 8121.

Thereby, in this embodiment, it is possible to stop the operation of the counter circuit 8121 between timing t2 and timing t3 and further reduce power consumption of the photoelectric conversion device 1.

Second Preferred Embodiment

Figure 4:
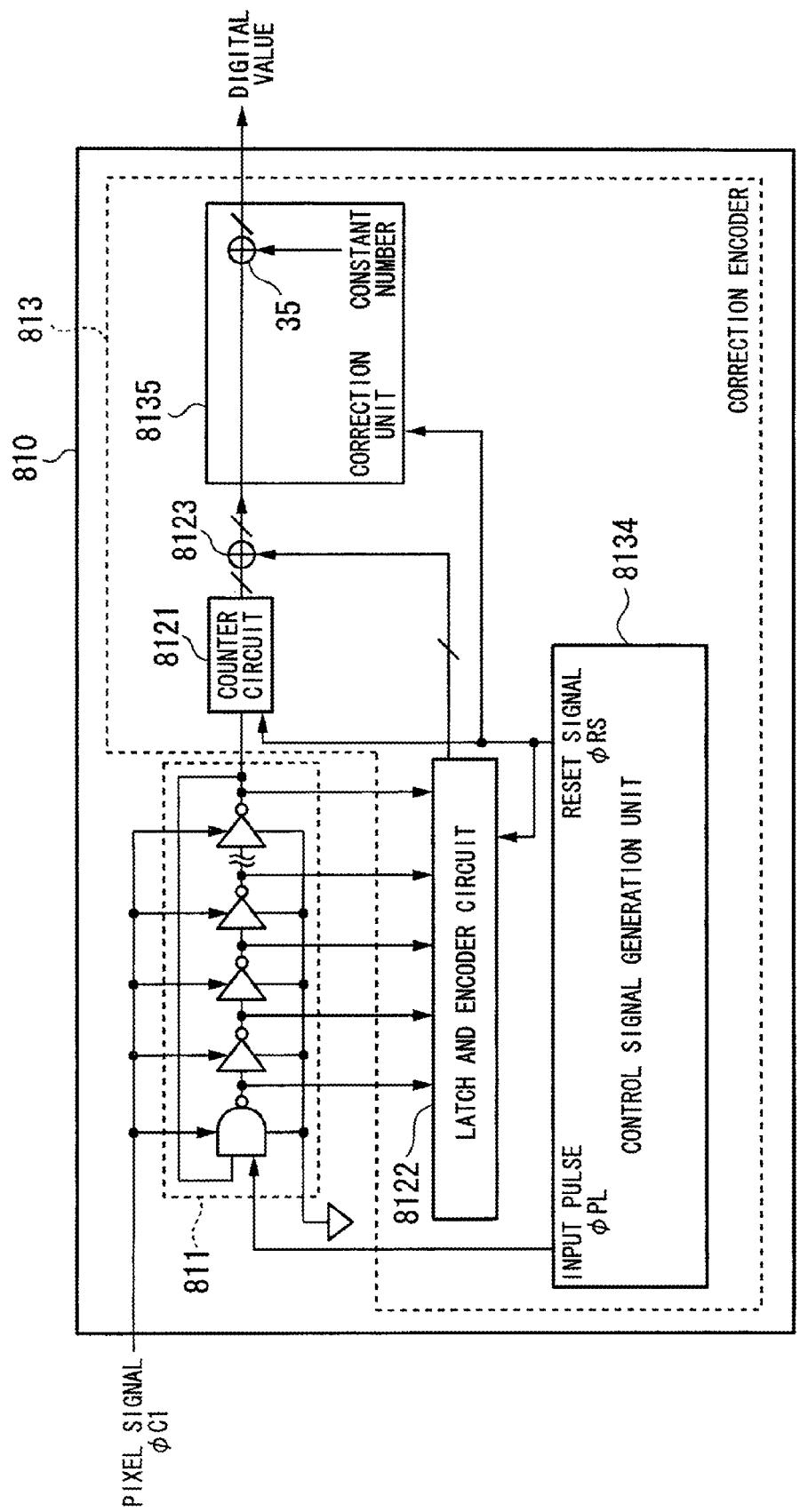
FIG. 4 is a block diagram illustrating a schematic configuration of an ADC in accordance with a second preferred embodiment of the present invention.

A second preferred embodiment of the present invention will be described with reference to the drawings. FIG. 4 is a block diagram illustrating a schematic configuration of an ADC (ADC 810) in accordance with the second preferred embodiment of the present invention. In FIG. 4, the ADC 810 includes a delay circuit 811 and a correction encoder 813. The correction encoder 813 includes a counter circuit 8121, a latch and encoder circuit 8122, an adder 8123, a control signal generation unit 8134, and a correction unit 8135.

The ADC 810 replaces the ADC 81 shown in the photoelectric conversion device 1 of FIG. 1. The correction unit 8135 is added to a rear stage of the adder 8123 for the ADC 81 shown in FIG. 2, and the control signal generation unit 8124 is changed to the control signal generation unit 8134. The timing of a reset signal φRS is different between the control signal generation unit 8134 and the control signal generation unit 8124 shown in FIG. 2.

Like the ADC 81 of the first embodiment shown in FIG. 2, the ADC 810 performs an analog-to-digital conversion on the pixel signal φC1 input from the CDS 51 in response to a timing signal of analog-to-digital conversion start (not shown). The ADC 810 retains an analog-to-digital conversion result in an output control circuit (not shown) of the ADC 810 in response to a timing signal of analog-to-digital conversion completion (not shown), and outputs a digital value retained in the output control circuit (not shown) in response to the column selection signal φH1 input from the horizontal scanning circuit 6.

In FIG. 4, the delay circuit 811 and the counter circuit 8121, the latch and encoder circuit 8122, and the adder 8123 of the correction encoder 813 in the ADC 810 perform the same operations as the corresponding blocks of the ADC 81 of the first embodiment shown in FIG. 2.

The control signal generation unit 8134 is a circuit that generates control signals to be input to the delay circuit 811, the counter circuit 8121, the latch and encoder circuit 8122, and the correction unit 8135 so as to correct a digital value to be output by the ADC 810.

An input pulse on φPL generated by the control signal generation unit 8134 for the delay circuit 811 is the same as that of the control signal generation unit 8124 shown in FIG. 2.

The control signal generation unit 8134 outputs the reset signal φRS for initializing the counter circuit 8121 at the timing when the analog-to-digital conversion is started by the ADC 810 and the timing when the analog-to-digital conversion is completed (for example, a pulse having the "High" level during a predetermined period). When an analog-to-digital conversion period ends, the rising timing of the reset signal φRS output by the control signal generation unit 8134 is also used as a timing signal for temporarily retaining the number of circulations of the input pulse φPL circulating within the delay circuit 811 by the counter circuit 8121 and a timing signal for temporarily retaining a value of each delay unit within the delay circuit 811 in which the input pulse φPL circulates by the latch and encoder circuit 8122.

The correction unit 8135 is a circuit that subtracts a predetermined constant digital value from the digital value output by the adder 8123, and outputs a digital value corresponding to an input signal, that is, the pixel signal φC1 input from the CDS 51 serving as an analog-to-digital conversion target, as a result of analog-to-digital conversion performed by the ADC 810.

The correction unit 8135 is constituted by an arithmetic circuit 35.

The arithmetic circuit 35 subtracts the predetermined constant digital value corresponding to an unstable digital value output in an unstable pulse period from the digital value input from the adder 8123.

In the present invention, a method of setting a value of the predetermined constant digital value to be subtracted from the digital value output from the adder 8123 and its digital value is not specified.

Figure 5:
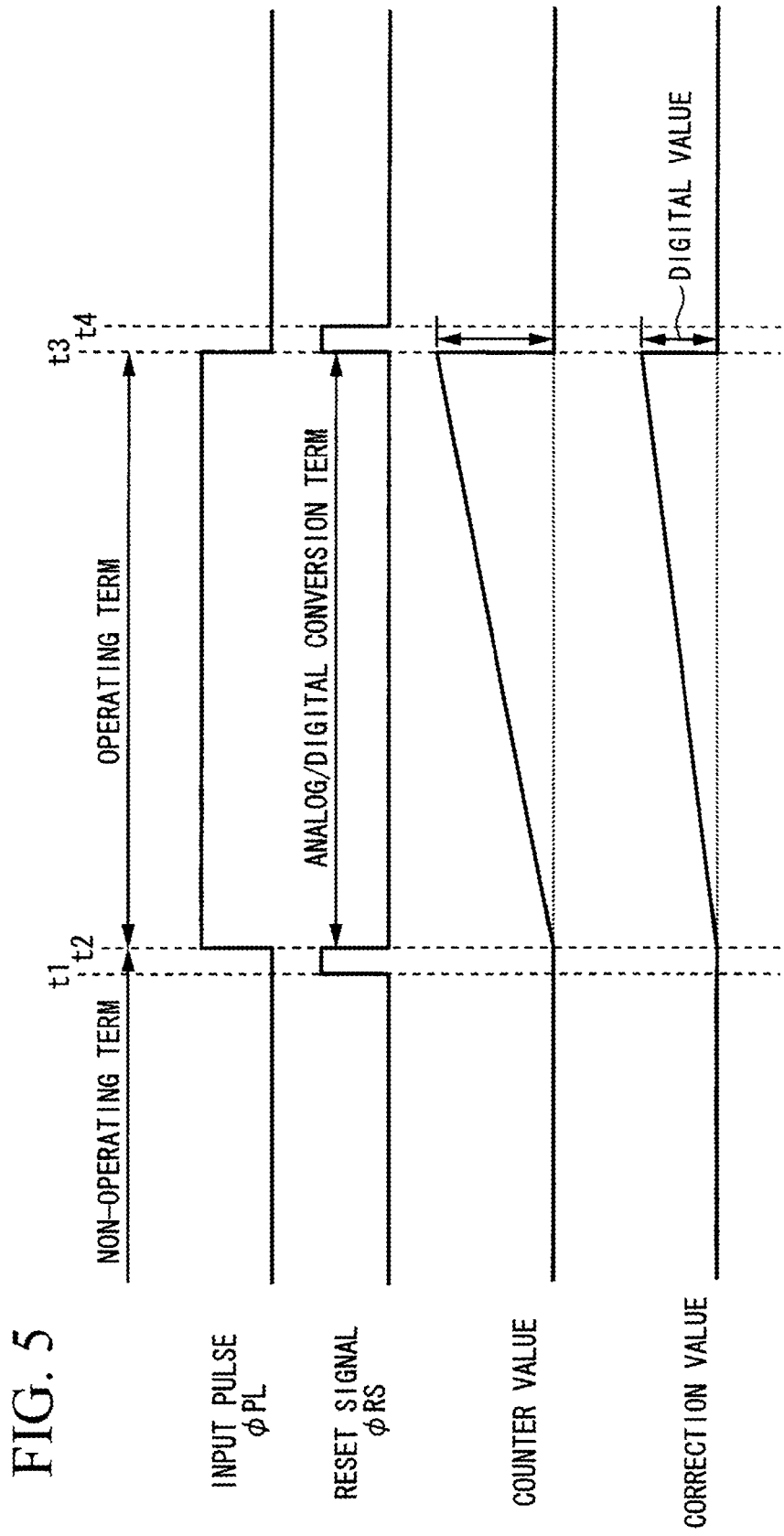
FIG. 5 is a timing chart illustrating an overview of an operation of an analog-to-digital conversion in the ADC in accordance with the second preferred embodiment of the present invention.

Next, the timing of analog-to-digital conversion in the ADC in accordance with the second preferred embodiment of the present invention will be described. FIG. 5 is a timing chart illustrating the overview of an operation of the analog-to-digital conversion in the ADC in accordance with the second preferred embodiment of the present invention. In this description, an example in which the ADC 810 arranged in the position of the ADC 81 of the photoelectric conversion device 1 shown in FIG. 1 performs an analog-to-digital conversion for a pixel P11 of a first column of the pixel array 3 will be described.

The timing of the reset signal φRS is different between the driving timing of the ADC 810 shown in FIG. 5 and the driving timing of the ADC 81 shown in FIG. 3.

The ADC timings corresponding to the pixel output signals φP1 corresponding to incident light amounts of the other pixels P21, P31, and P41 of the first column of the pixel array 3 and ADCs 82 to 85 are the same as the timing of the ADC 810 shown in FIG. 5.

The timings of the pixel output signal e1 output by the pixel array 3 and the pixel signal φC1 output by the CDS 5 are the same as those shown in FIG. 3.

In FIG. 5, if initialization and image acquisition commands from an outside (not shown) are input to the photoelectric conversion device 1 shown in FIG. 1 and the pixel output signal φP1 corresponding to an incident light amount of the pixel P11 selected by the row selection signal φSL1 input from the vertical scanning circuit 4 is input, the control signal generation unit 8134 sets the reset signal φRS to the "High" level at timing t1. Thereby, a detection result of the counter circuit 8121 is initialized.

Subsequently, if the control signal generation unit 8134 sets the input pulse φPL to circulate within the delay circuit 811 to the "High" level at timing t2, the input pulse φPL circulates within the delay circuit 811 during a delay time corresponding to a level difference between a voltage level of the pixel signal φC1 input from the CDS 51 and a reference voltage (for example, a GND level in FIG. 4). The control signal generation unit 8134 sets the reset signal φRS to the "Low" level at timing t2, so that the counter circuit 8121 and the latch and encoder circuit 8122 start to detect each delay unit within the delay circuit 811. A result of delay unit detection started at timing t2 includes an unstable pulse period.

Subsequently, the analog-to-digital conversion period ends at timing t3, and the circulation within the delay circuit 811 of the input pulse φPL is stopped if the control signal generation unit 8134 sets the input pulse φPL to the "Low" level. The control signal generation unit 8134 sets the reset signal φRS to the "High" level. At the rising timing of the reset signal φRS, the number of circulations of the input pulse φPL circulating within the delay circuit 811 detected by the counter circuit 8121 and the number of stages of delay units through which the input pulse φPL has passed within the delay circuit 811 detected by the latch and encoder circuit 8122 are temporarily retained. Thereafter, the adder 8123 processes the temporarily retained number of circulations and the number of passage stages, and outputs a digital value corresponding to an incident light amount of the pixel P11 to the correction unit 8135.

Thereafter, the correction unit 8135 subtracts a predetermined constant digital value corresponding to an unstable digital value output in an unstable pulse period from the digital value corresponding to the incident light amount of the pixel P11 output by the adder 8123, and outputs a digital value as its result (a digital value after correction).

The digital value output from the correction unit 8135 is retained in the output control circuit (not shown) within the ADC 810. Thereafter, if the ADC 810 is selected by the column selection signal φH1 input from the horizontal scanning circuit 6, the digital value retained in the output control circuit (not shown) within the ADC 810, that is, the digital value corresponding to the incident light amount of the pixel P11, is output as an analog-to-digital conversion result.

Subsequently, the control signal generation unit 8134 sets the reset signal φRS to the "Low" level at timing t4, so that the analog-to-digital conversion of the pixel output signal φP1 corresponding to the incident light amount of the pixel P11 is completed.

Thereafter, as in timings t1 to t4 described above, the ADC 810 outputs digital values corresponding to incident light amounts of the pixels P21, P31, and P41 as analog-to-digital conversion results, and the analog-to-digital conversion for the pixel array 3, that is, the reading of all image signals of the photoelectric conversion device 1, is completed.

In the second embodiment of the present invention as described above, it is also possible to obtain good image data (a digital value after correction) in which noise appearing in an output image is reduced because an unstable digital value to be output in an unstable pulse period can be corrected (subtracted) when an analog-to-digital conversion into a digital value corresponding to an incident light amount of a pixel P is performed.

Third Preferred Embodiment

Figure 6:
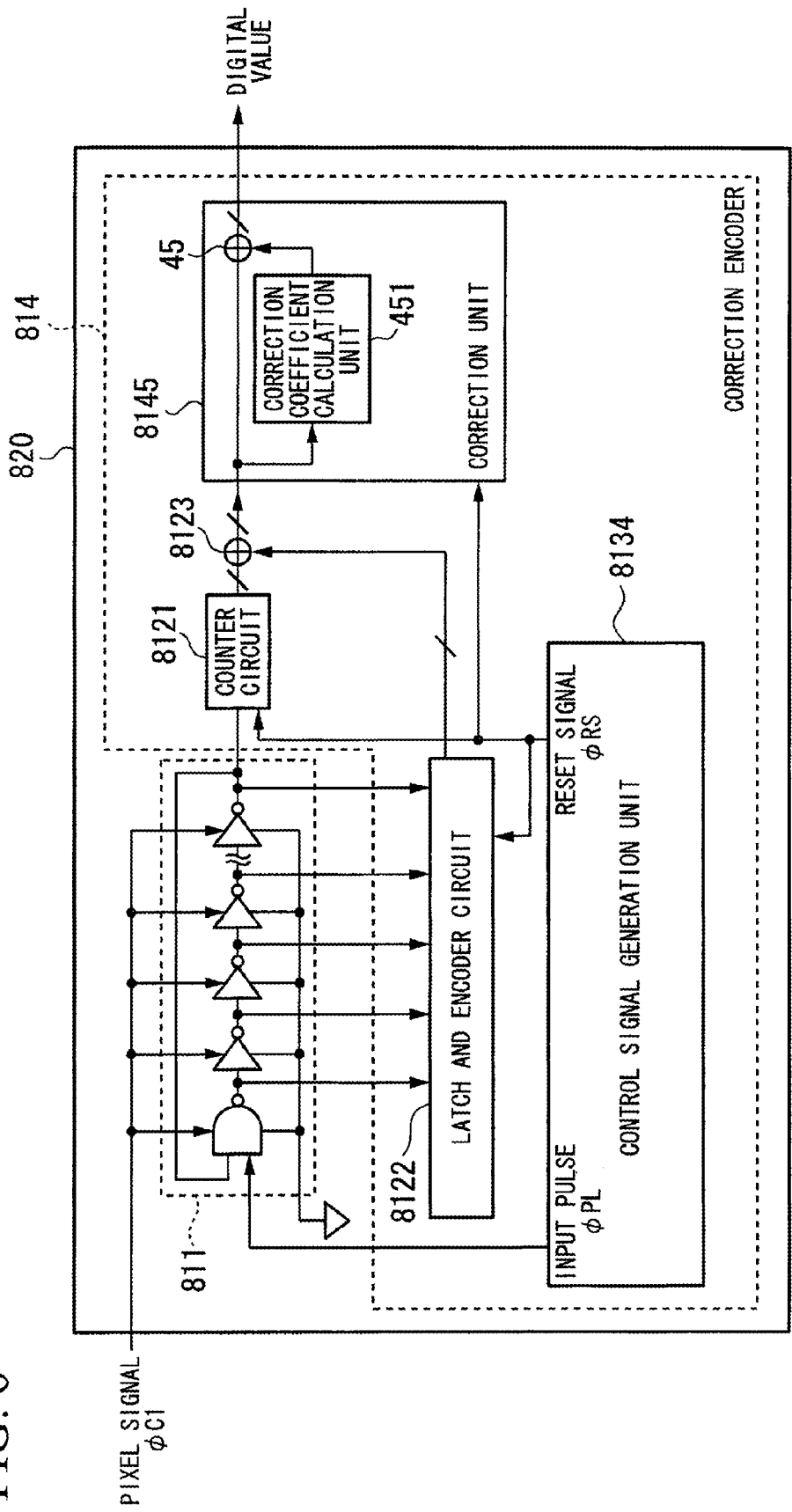
FIG. 6 is a block diagram illustrating a schematic configuration of an ADC in accordance with a third preferred embodiment of the present invention.

A third preferred embodiment of the present invention will be described with reference to the drawings. FIG. 6 is a block diagram illustrating a schematic configuration of an ADC (ADC 820) in accordance with the third preferred embodiment of the present invention. In FIG. 6, the ADC 820 includes a delay circuit 811 and a correction encoder 814. The correction encoder 814 includes a counter circuit 8121, a latch and encoder circuit 8122, an adder 8123, a control signal generation unit 8134, and a correction unit 8145.

The ADC 820 replaces the ADC 81 shown in the photoelectric conversion device 1 of FIG. 1, and the correction unit 8135 of the ADC 810 shown in FIG. 4 is changed to the correction unit 8145.

An internal configuration is different between the correction unit 8145 and the correction unit 8135 shown in FIG. 4.

Like the ADC 81 of the first embodiment shown in FIG. 2, the ADC 820 performs an analog-to-digital conversion on the pixel signal φC1 input from the CDS 51 in response to a timing signal of analog-to-digital conversion start (not shown). The ADC 820 retains an analog-to-digital conversion result in an output control circuit (not shown) of the ADC 820 in response to a timing signal of analog-to-digital conversion completion (not shown), and outputs a digital value retained in the output control circuit (not shown) in response to the column selection signal φH1 input from the horizontal scanning circuit 6.

In FIG. 6, the delay circuit 811 and the counter circuit 8121, the latch and encoder circuit 8122, and the adder 8123 of the correction encoder 814 in the ADC 820 perform the same operations as the corresponding blocks of the ADC 81 of the first embodiment shown in FIG. 2 and the ADC 810 of the second embodiment shown in FIG. 4. The control signal generation unit 8134 of the correction encoder 814 performs the same operation as the corresponding block of the ADC 810 of the second embodiment shown in FIG. 4.

The correction unit 8145 is a circuit that outputs a digital value corresponding to an input signal, that is, the pixel signal φC1 input from the CDS 51 serving as an analog-to-digital conversion target, as a result of analog-to-digital conversion performed by the ADC 820 by calculating a correction coefficient corresponding to a digital value output by the adder 8123 and subtracting a correction value (digital value) corresponding to the calculated correction coefficient from the digital value output by the adder 8123.

The correction unit 8145 includes an arithmetic circuit 45 and a correction coefficient calculation unit 451.

The correction coefficient calculation unit 451 is an arithmetic circuit that calculates a correction coefficient of a predetermined constant rate according to an unstable pulse period from the digital value input from the adder 8123, and generates a correction value (digital value) corresponding to the calculated correction coefficient.

The correction coefficient calculation unit 451 outputs the generated correction value (digital value) to the arithmetic circuit 45.

For example, it is possible to pre-measure a temperature characteristic of the photoelectric conversion device 1 for an ambient temperature of the environment used in the photoelectric conversion device 1 of FIG. 1, that is, a change of a digital value output from the adder 8123 due to an ambient temperature difference when the same pixel signal φC1 is input, and set a correction rate of the ambient temperature difference to a correction coefficient. For example, the temperature characteristic of the photoelectric conversion device 1 is that the digital value output from the adder 8123 is increased by 10% if the ambient temperature is increased by 10° C. The ambient temperature of the photoelectric conversion device 1 is measured by a temperature sensor or the like when the photoelectric conversion device 1 is operated. In the description below, the ambient temperature of the photoelectric conversion device 1 is increased by 20° C. It is calculated from the measured ambient temperature and the temperature characteristic that the digital value output from the adder 8123 is increased by 20%. The correction coefficient calculation unit 451 sets the calculated value (20%) as the correction coefficient. Using the calculated correction coefficient (20%), a value corresponding to the correction coefficient (20%) of the digital value output from the adder 8123 is calculated and set as the correction value. Thereby, it is possible to reduce the influence of the ambient temperature of the digital value output by the photoelectric conversion device 1.

In the present invention, a correction coefficient setting method and a calculation method are not specified.

The arithmetic circuit 45 subtracts the correction value (digital value) input from the correction coefficient calculation unit 451 from the digital value input from the adder 8123.

The timing of analog-to-digital conversion in the ADC in accordance with the third preferred embodiment of the present invention is the same as the timing of analog-to-digital conversion in the ADC in accordance with the second preferred embodiment of the present invention shown in FIG. 5.

However, a digital value (a digital value after correction) is calculated on the basis of a correction coefficient of a predetermined constant rate according to an unstable pulse period from a digital value input from the adder 8123 by the correction coefficient calculation unit 451 in the correction of a digital value corresponding to an incident light amount of the pixel P11 output by the adder 8123 at timing t3.

In the third preferred embodiment of the present invention as described above, it is also possible to obtain good image data (a digital value after correction) in which noise appearing in an output image is reduced by the correction coefficient because an unstable digital value to be output in an unstable pulse period can be corrected when an analog-to-digital conversion into a digital value corresponding to an incident light amount of a pixel P is performed.

Fourth Preferred Embodiment

Figure 7:
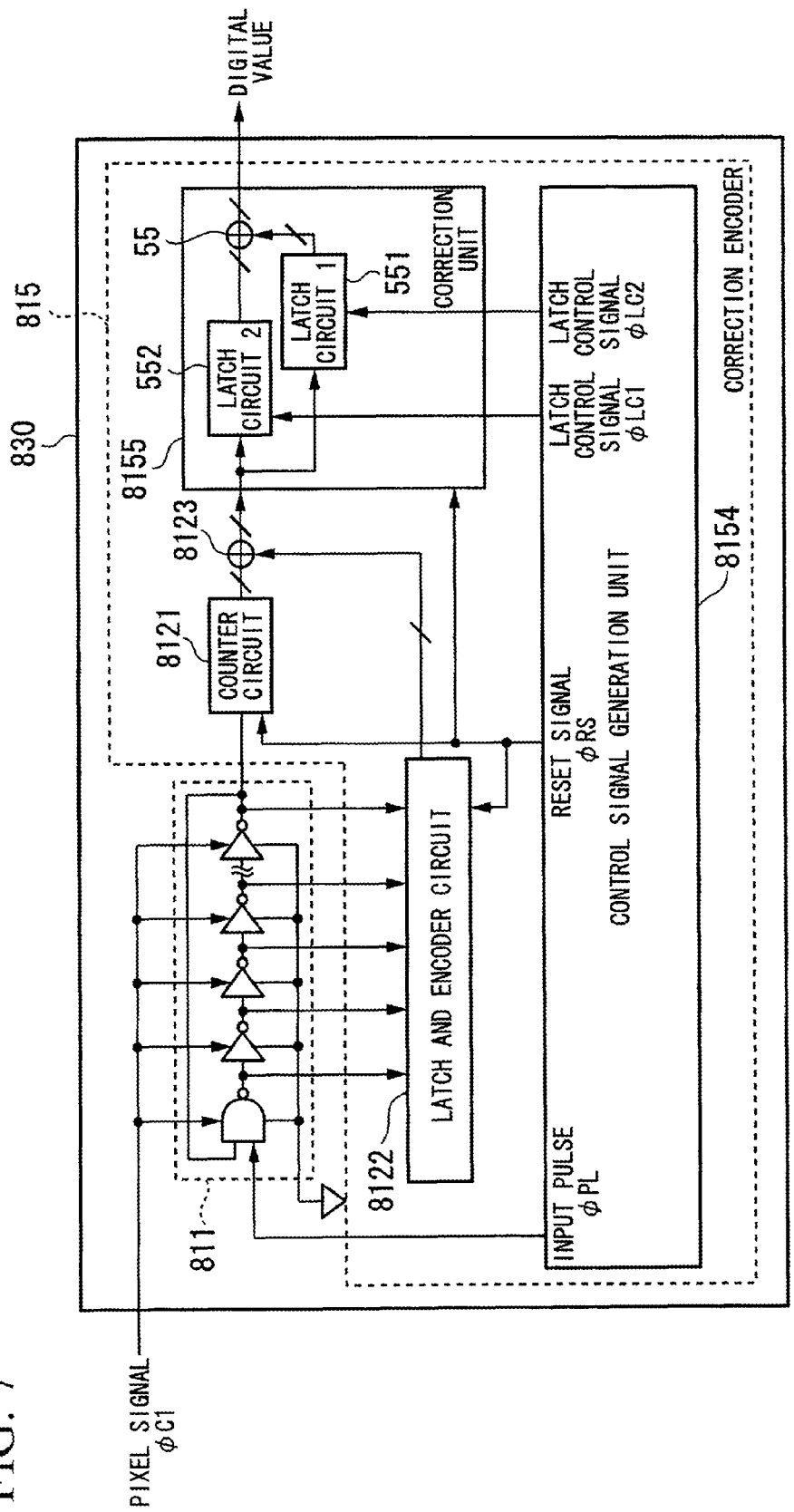
FIG. 7 is a block diagram illustrating a schematic configuration of an ADC in accordance with a fourth preferred embodiment of the present invention.

A fourth preferred embodiment of the present invention will be described with reference to the drawings. FIG. 7 is a block diagram illustrating a schematic configuration of an ADC (ADC 830) in accordance with the fourth preferred embodiment of the present invention. In FIG. 7, the ADC 830 includes a delay circuit 811 and a correction encoder 815. The correction encoder 815 includes a counter circuit 8121, a latch and encoder circuit 8122, an adder 8123, a control signal generation unit 8154, and a correction unit 8155.

The ADC 830 replaces the ADC 81 shown in the photoelectric conversion device 1 of FIG. 1. The control signal generation unit 8134 of the ADC 810 shown in FIG. 4 is changed to the control signal generation unit 8154, and the correction unit 8135 is changed to the correction unit 8155.

Like the ADC 81 in accordance with the first preferred embodiment of the present invention shown in FIG. 2, the ADC 830 performs an analog-to-digital conversion on the pixel signal φC1 input from the CDS 51 in response to a timing signal of analog-to-digital conversion start (not shown). The ADC 830 retains an analog-to-digital conversion result in an output control circuit (not shown) of the ADC 830 in response to a timing signal of analog-to-digital conversion completion (not shown), and outputs a digital value retained in the output control circuit (not shown) in response to the column selection signal φH1 input from the horizontal scanning circuit 6.

In FIG. 7, the delay circuit 811 and the counter circuit 8121, the latch and encoder circuit 8122, and the adder 8123 of the correction encoder 815 in the ADC 830 perform the same operations as the corresponding blocks of the ADC 81 in accordance with the first preferred embodiment of the present invention shown in FIG. 2, the ADC 810 in accordance with the second preferred embodiment of the present invention shown in FIG. 4, and the ADC 820 in accordance with the third preferred embodiment of the present invention shown in FIG. 6. An input signal φPL and a reset signal φRS generated by the control signal generation unit 8154 of the correction encoder 815 are the same as those of the corresponding blocks of the ADC 810 of the second preferred embodiment of the present invention shown in FIG. 4 and the ADC 820 in accordance with the third preferred embodiment of the present invention shown in FIG. 6, but a latch control signal φLC1 and a latch control signal φLC2 for controlling the correction unit 8155 are newly added.

The correction unit 8155 is a circuit that outputs a digital value corresponding to an input signal, that is, the pixel signal φC1 input from the CDS 51 serving as an analog-to-digital conversion target, as a result of analog-to-digital conversion performed by the ADC 830 by temporarily retaining a digital value output by the adder 8123 and performing a correction on the basis of the temporarily retained digital value.

The correction unit 8155 includes a first latch circuit 551, a second latch circuit 552, and an arithmetic circuit 55.

The first latch circuit 551 temporarily retains a digital value input from the adder 8123 in response to the latch control signal φLC1 input from the control signal generation unit 8154 (for example, at the rising timing of the latch control signal φLC1).

The second latch circuit 552 temporarily retains a digital value input from the adder 8123 in response to the latch control signal φLC2 input from the control signal generation unit 8154 (for example, at the rising timing of the latch control signal φLC2).

The arithmetic circuit 55 subtracts the digital value temporarily retained in the first latch circuit 551 from the digital value temporarily retained in the second latch circuit 552.

The control signal generation unit 8154 is a circuit that generates control signals to be input to the delay circuit 811, the counter circuit 8121, the latch and encoder circuit 8122, and the correction unit 8155 so as to correct a digital value to be output by the ADC 830.

The input pulse φPL and the reset signal φRS generated by the control signal generation unit 8154 for the delay circuit 811 are the same as those of the control signal generation unit 8134 shown in FIGS. 4 and 6.

The control signal generation unit 8154 outputs the latch control signal φLC1 for temporarily retaining a digital value input from the adder 8123 in the first latch circuit 551 at the timing when an unstable pulse period ends (for example, a pulse having the "High" level during a predetermined period).

The control signal generation unit 8154 outputs the latch control signal φLC2 for temporarily retaining a digital value input from the adder 8123 in the second latch circuit 552 at the timing when an analog-to-digital conversion period ends (for example, a pulse having the "High" level during a predetermined period).

By the configuration described above, an unstable digital value output in a predetermined period, that is, an unstable pulse period, can be temporarily retained in the first latch circuit 551, and digital values of the entire analog-to-digital conversion period including the unstable pulse period can be temporarily retained in the second latch circuit 552.

Thereafter, the arithmetic circuit 55 of the correction unit 8155 can subtract the digital value temporarily retained in the first latch circuit 551, that is, the unstable digital value output in the unstable pulse period, from the digital values temporarily retained in the second latch circuit 552, that is, the digital values of the entire analog-to-digital conversion period including the unstable pulse period, thereby obtaining digital values as results (digital values after corrections).

The digital value output from the correction unit 8155 is retained in an output control circuit (not shown) within the ADC 830. Thereafter, if the ADC 830 is selected by the column selection signal φH1 input from the horizontal scanning circuit 6, the digital value retained in the output control circuit (not shown) within the ADC 830, that is, the digital value corresponding to the incident light amount of the pixel P11, is output as an analog-to-digital conversion result.

Figure 8:
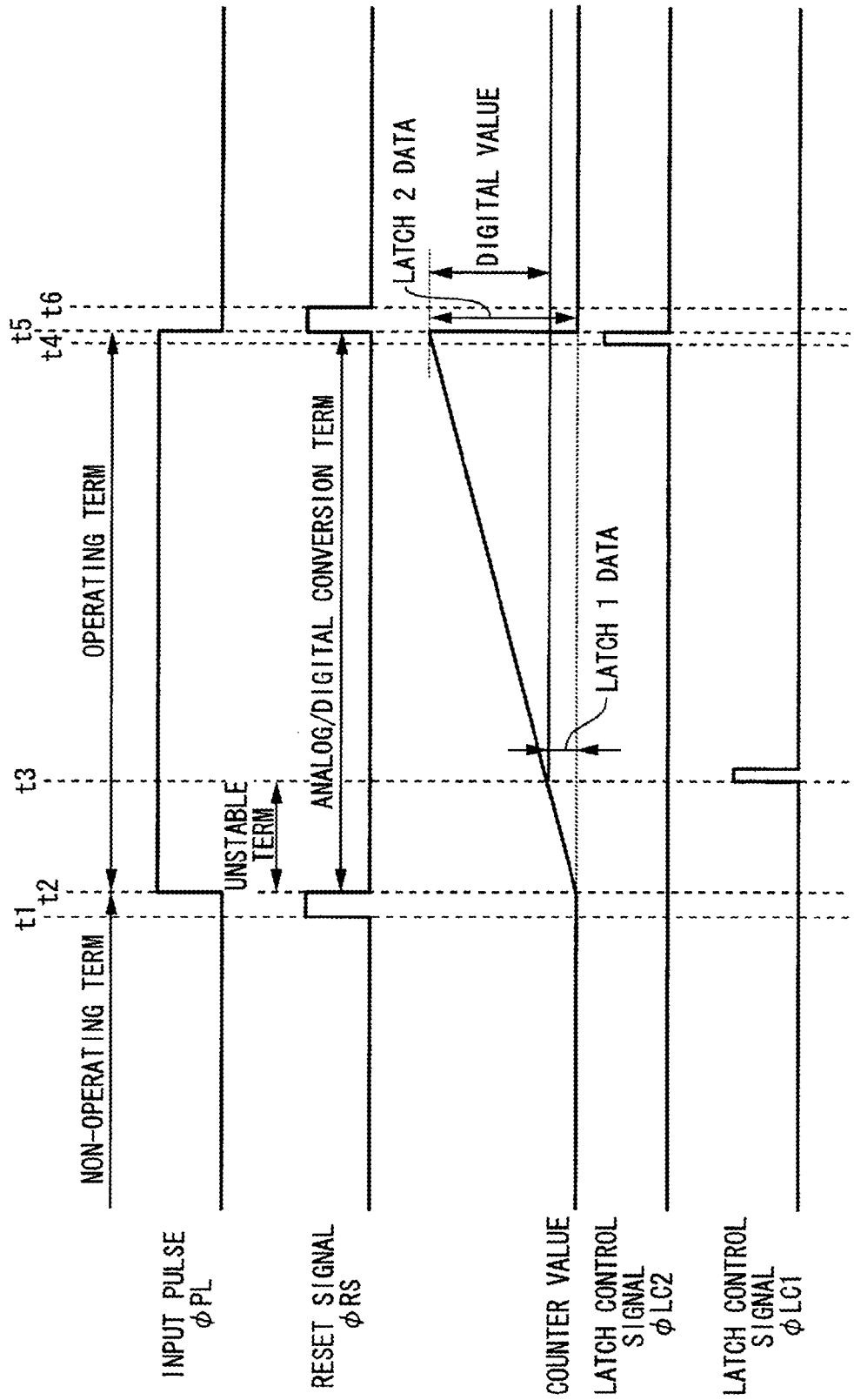
FIG. 8 is a timing chart illustrating an overview of an operation of an analog-to-digital conversion in the ADC in accordance with the fourth preferred embodiment of the present invention.

Next, the timing of analog-to-digital conversion in the ADC in accordance with the fourth preferred embodiment of the present invention will be described. FIG. 8 is a timing chart illustrating the overview of an operation of the analog-to-digital conversion in the ADC in accordance with the fourth preferred embodiment of the present invention. In this description, an example in which the ADC 830 arranged in the position of the ADC 81 of the photoelectric conversion device 1 shown in FIG. 1 performs an analog-to-digital conversion for the pixel P11 of a first column of the pixel array 3 will be described.

The driving timing of the ADC 830 shown in FIG. 8 is the same as the driving timing of the ADC 81 shown in FIG. 5, but the output timings of the latch control signals φLC1 and φLC2 for controlling the correction unit 8155 are newly added.

The ADC timings corresponding to the pixel output signals φP1 corresponding to incident light amounts of the other pixels P21, P31, and P41 of the first column of the pixel array 3 and the ADCs 82 to 85 are the same as the timing of the ADC 810 shown in FIG. 5.

The timings of the pixel output signal φP1 output by the pixel array 3 and the pixel signal φC1 output by the CDS 5 are the same as those shown in FIG. 3.

In FIG. 8, if the pixel output signal φP1 from the pixel P11 is input according to initialization and image acquisition commands from an outside (not shown) input to the photoelectric conversion device 1 shown in FIG. 1, the control signal generation unit 8154 initializes a detection result of the counter circuit 8121 by setting the reset signal φRS to the "High" level at timing t1 like timing t1 shown in FIG. 5.

Subsequently, the control signal generation unit 8154 sets the input pulse φPL to circulate within the delay circuit 811 to the "High" level at timing 12 like timing t2 shown in FIG. 5, so that the input pulse φPL circulates within the delay circuit 811 during a delay time corresponding to a level difference between a voltage level of the pixel signal φC1 input from the CDS 51 and a reference voltage (for example, the GND level in FIG. 7). The control signal generation unit 8154 sets the reset signal φRS to the "Low" level, so that the counter circuit 8121 and the latch and encoder circuit 8122 start to detect each delay unit within the delay circuit 811. A result of delay unit detection started at timing t2 includes an unstable pulse period as in the timing chart shown in FIG. 5.

Subsequently, at timing t3, the control signal generation unit 8154 outputs the latch control signal φLC1 of the first latch circuit 551 (for example, a "High" pulse) if the unstable pulse period ends.

According to the latch control signal φLC1, the first latch circuit 551 temporarily retains a digital value input from the adder 8123 in the unstable pulse period, that is, an unstable digital value output in the unstable pulse period.

Subsequently, at timing t4, the control signal generation unit 8154 outputs the latch control signal φLC2 of the second latch circuit 552 (for example, the "High" pulse) immediately before the analog-to-digital conversion period ends.

According to the latch control signal φLC2, the second latch circuit 552 temporarily retains digital values of the entire analog-to-digital conversion period including the unstable pulse period.

Thereafter, the arithmetic circuit 55 subtracts the digital value output in the unstable pulse period temporarily retained in the first latch circuit 551 from the digital values of the entire analog-to-digital conversion period temporarily retained in the second latch circuit 552, and outputs digital values as results (digital values after corrections).

Subsequently, at timing t5, like timing t3 shown in FIG. 5, the control signal generation unit 8154 stops the circulation within the delay circuit 811 of the input pulse φPL by setting the input pulse φPL to the "Low" level if the analog-to-digital conversion period (not shown) ends, and the control signal generation unit 8154 sets the reset signal φRS to the "High" level, so that the digital values calculated by the arithmetic circuit 55 (the digital values after the corrections) are retained in the output control circuit (not shown) within the ADC 830.

Subsequently, at timing t6, the control signal generation unit 8154 sets the reset signal φRS to the "Low" level, so that an analog-to-digital conversion of the pixel output signal φP1 corresponding to an incident light amount of the pixel P11 is completed.

The ADC 830 is selected by the column selection signal φH1 input from the horizontal scanning circuit 6, so that the digital values calculated by the arithmetic circuit 55 (digital values after corrections) retained in the output control circuit (not shown) within the ADC 830 are read from the output control circuit (not shown) within the ADC 830 and a digital value corresponding to the incident light amount of the pixel P11 is output as an analog-to-digital conversion result.

Thereafter, as in timings t1 to t6 described above, the ADC 830 outputs digital values corresponding to incident light amounts of the pixels 21, 31, and 41 as analog-to-digital conversion results, and the analog-to-digital conversion for the pixel array 3, that is, the reading of all image signals of the photoelectric conversion device 1, is completed.

In the fourth preferred embodiment of the present invention as described above, it is also possible to obtain good image data (a digital value after correction) in which noise appearing in an output image is reduced because an unstable digital value to be output in an unstable pulse period can be corrected (subtracted) when an analog-to-digital conversion into a digital value corresponding to an incident light amount of a pixel P is performed.

The correction unit 8155 in accordance with the fourth preferred embodiment of the present invention is configured to have the first latch circuit 551 and the second latch circuit 552, but it is possible to make a configuration that includes only the first latch circuit 551, subtracts an unstable digital value to be output in an unstable pulse period temporarily retained in the first latch circuit 551 from a digital value input from the adder 8123, and outputs a digital value as a result (a digital value after correction). In this configuration, at timing t5 of FIG. 8, like timing t3 shown in FIG. 5, the number of circulations of the input pulse φPL circulating within the delay circuit 811 detected by the counter circuit 8121 and the number of stages of delay units through which the input pulse φPL has passed within the delay circuit 811 detected by the latch and encoder circuit 8122 are temporarily retained at the rising timing of the reset signal φRS controlled by the control signal generation unit 8154. Thereafter, the arithmetic circuit 55 can correct (subtract) a digital value using a digital value corresponding to an incident light amount of the pixel P11 output through processing by the adder 8123.

According to the best mode for carrying out the present invention as described above, it is possible to obtain a good digital value in which noise included in a digital value of an unstable period is reduced because the digital value of the unstable period can be corrected by a digital value output after an operation start of the ADC provided in the photoelectric conversion device.

Thereby, it is possible to actively stop the operation of the ADC provided in the photoelectric conversion device and reduce power consumption of a digital camera, a digital video camera, or the like if the photoelectric conversion device of the present invention is mounted in the digital camera, the digital video camera, or the like that operate with a cell or battery.

Figure 9:
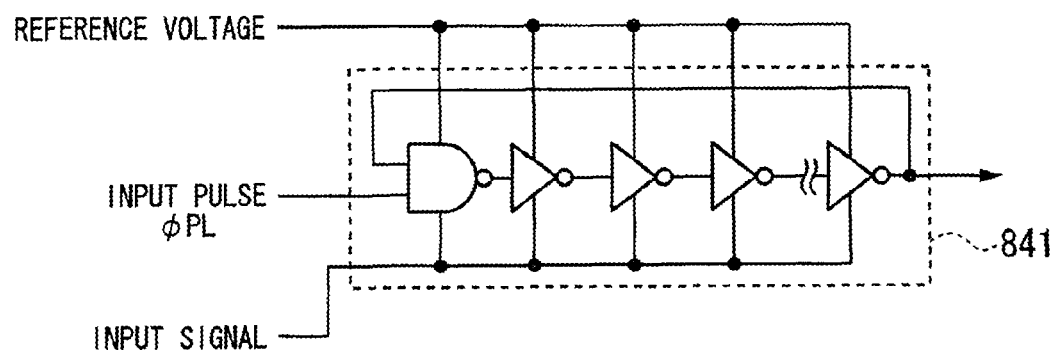
FIG. 9 is a view illustrating another example of a configuration of a delay circuit in accordance with the embodiments of the present invention.

The delay unit in the delay circuit 811 in accordance with the embodiments of the present invention configured to have an input signal of a power supply side, that is, the pixel signal φC1 serving as an analog-to-digital conversion target, and a reference voltage of a ground side has been described, but a reference voltage of the power supply side and an input signal of the ground side can be configured as shown in the delay circuit 841 of FIG. 9.

Figure 10:
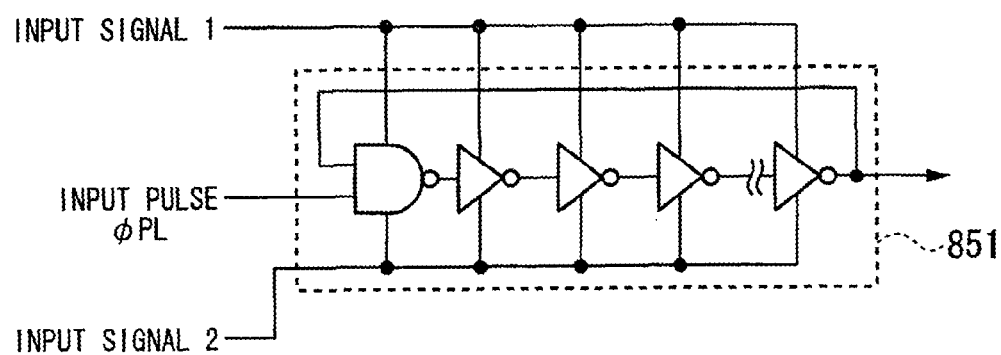
FIG. 10 is a view illustrating another example of a configuration of a delay circuit in accordance with the embodiments of the present invention.
Figure 11:
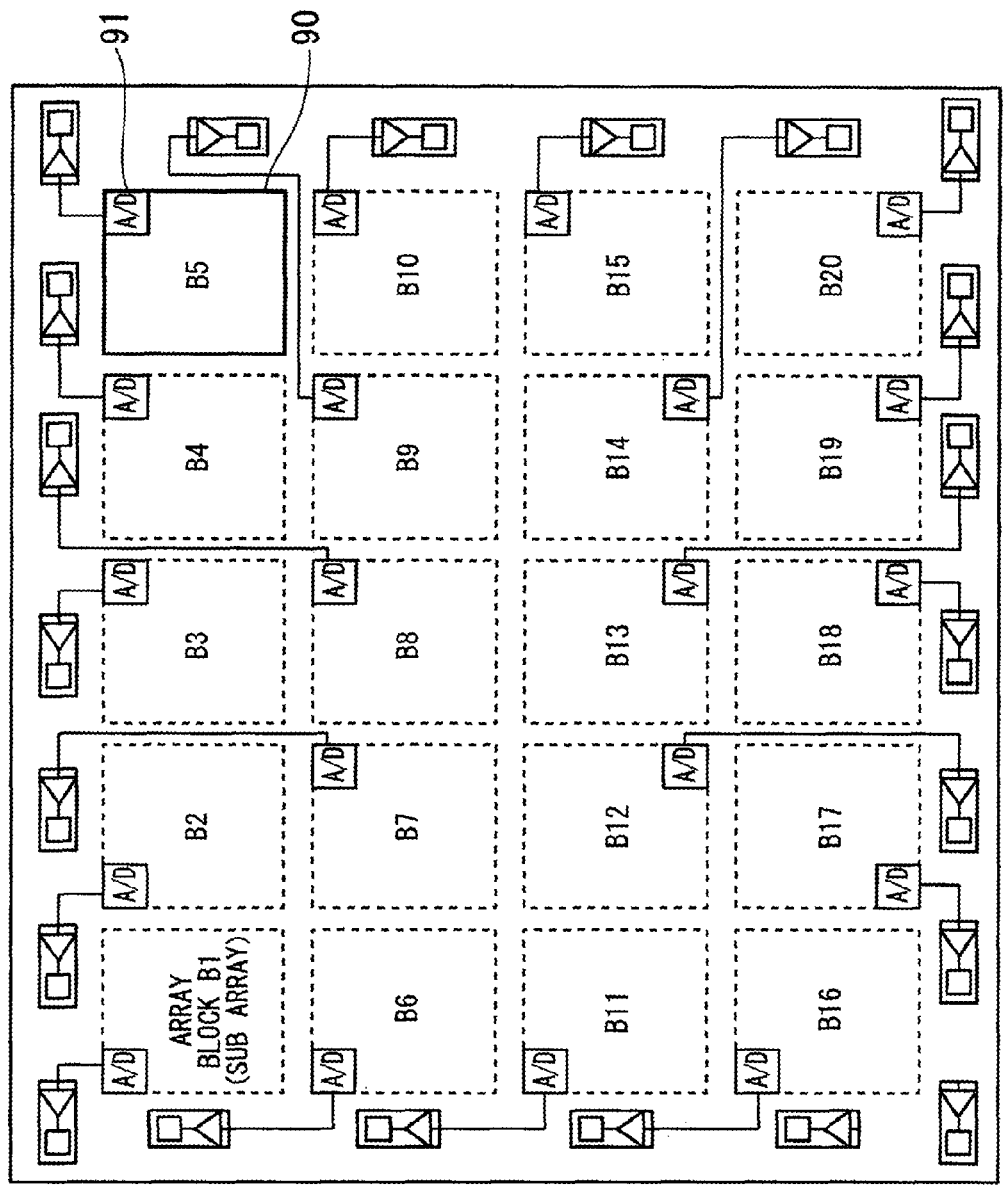
FIG. 11 is a block diagram illustrating a schematic configuration of a solid-state imaging device in accordance with the related art.
Figure 12:
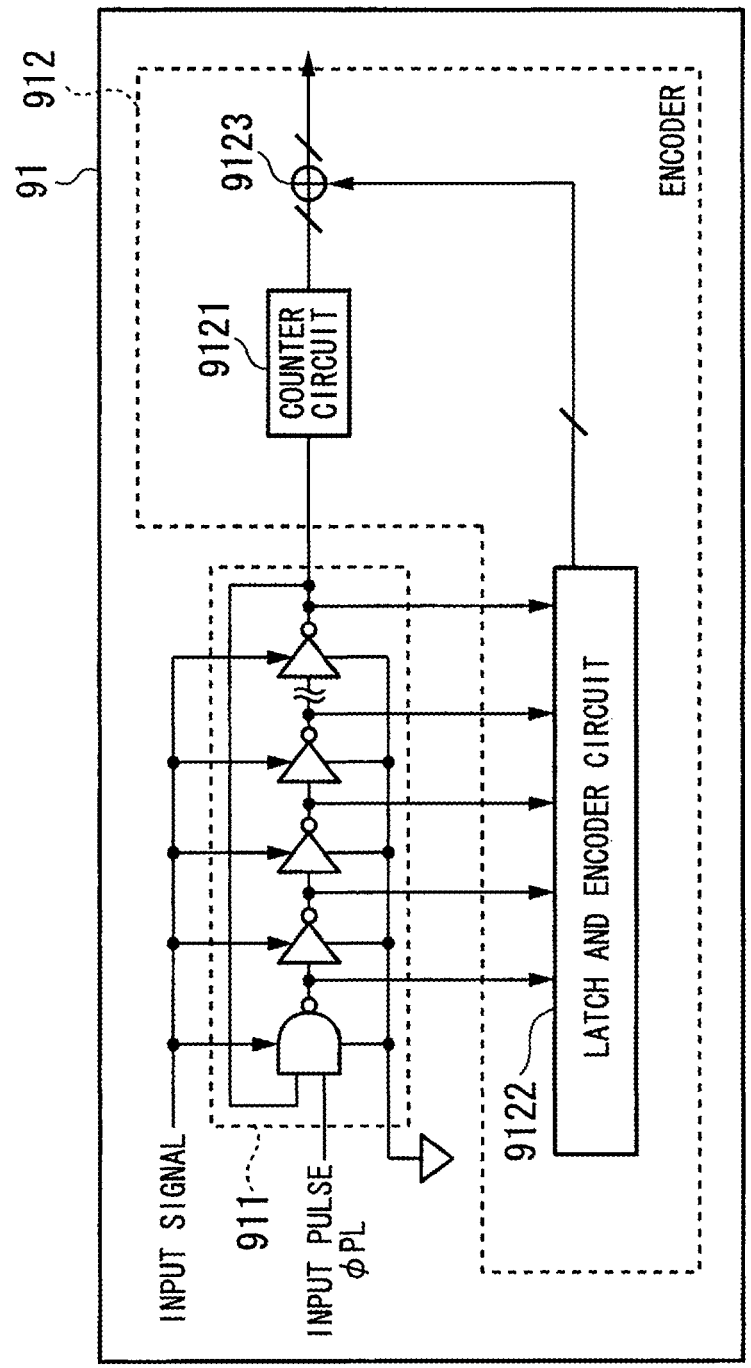
FIG. 12 is a block diagram illustrating an example of a circuit configuration of the ADC provided in the solid-state imaging device in accordance with the related art.
Figure 13:
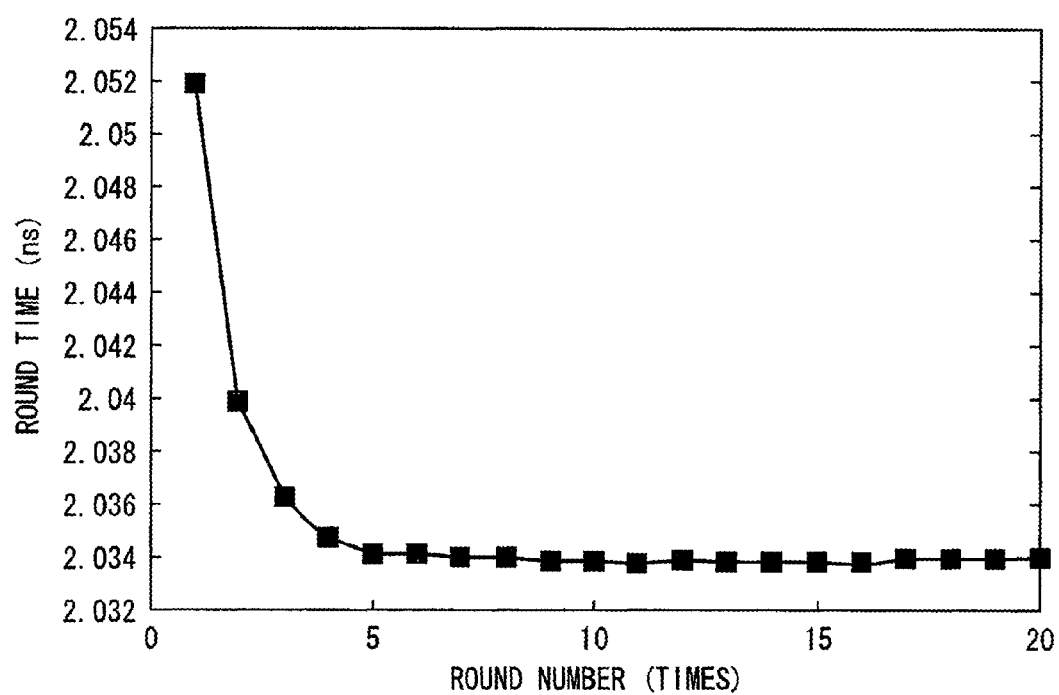
FIG. 13 is a graph illustrating an example of a relationship between a circulation time in which the input pulse signal circulates within a delay circuit from an operation start time of an ADC provided in the solid-state imaging device and a number of circulations in accordance with the related art.

If there are two types of input signals, the first input signal of the power supply side and the second input signal of the ground side can be configured as shown in the delay circuit 851 of FIG. 10. In contrast to the delay circuit 851 of FIG. 10, the second input signal of the power supply side and the first input signal of the ground side can be configured.

The delay circuit in accordance with the preferred embodiments of the present invention in which a first-stage delay unit is constituted by a NAND circuit (NAND gate) and the other delay units are constituted by NOT circuits (NOT gates) has been described, but the configuration of the delay circuit is not specified in the present invention. That is, the delay circuit can be applied to any configuration as long as an input pulse circulates with a delay time corresponding to a voltage level of an input signal and a voltage level of a reference voltage or a level difference between voltage levels of two input signals.

The present invention can obtain a good digital value by performing an analog-to-digital conversion on a pixel signal corresponding to an incident light amount of a photoelectric conversion element.

While preferred embodiments of the present invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the claims.

What is claimed is:

1. A photoelectric conversion device comprising:
   a pixel array including a plurality of two-dimensionally arranged pixels, each of which has a photoelectric conversion element and outputs a pixel signal corresponding to an amount of light incident on the photoelectric conversion element; and
   a plurality of analog-to-digital converters (ADCs), each of which converts the pixel signal read from the pixel array into a digital value and outputs the digital value,
   wherein each ADC comprises:
      a pulse delay circuit including a plurality of connected delay unit stages, each of which delays a pulse signal during a delay time corresponding to a magnitude of a voltage of the pixel signal read from the pixel array;
      an encoder unit that outputs a digital value based on the number of stages of the delay units through which the pulse signal has passed during a predetermined time; and
      a correction unit that corrects the digital value output by the encoder unit by a rate corresponding to the number of stages of the delay units through which the pulse signal has passed during a predetermined period, and
   wherein the correction unit comprises a subtraction unit that subtracts a predetermined value from the digital value output from the encoder unit.

2. The photoelectric conversion device according to claim 1, wherein the correction unit invalidates a digital value corresponding to the number of stages of the delay units through which the pulse signal has passed until a predetermined period has elapsed after the pixel signal has started to be read from the pixel array.

3. A photoelectric conversion device comprising:
a pixel array including a plurality of two-dimensionally arranged pixels, each of which has a photoelectric conversion element and outputs a pixel signal corresponding to an amount of light incident on the photoelectric conversion element; and
a plurality of analog-to-digital converters (ADCs), each of which converts the pixel signal read from the pixel array into a digital value and outputs the digital value,
wherein each ADC comprises:
 a pulse delay circuit including a plurality of connected delay unit stages, each of which delays a pulse signal during a delay time corresponding to a magnitude of a voltage of the pixel signal read from the pixel array;
 an encoder unit that outputs a digital value based on the number of stages of the delay units through which the pulse signal has passed during a predetermined time; and
 a correction unit that corrects the digital value output by the encoder unit by a rate corresponding to the number of stages of the delay units through which the pulse signal has passed during a predetermined period, and
wherein the correction unit comprises:
 an arithmetic unit that calculates a subtraction value according to the digital value output from the encoder unit; and
 a subtraction unit that subtracts the subtraction value calculated by the arithmetic unit from the digital value output from the encoder unit.

4. The photoelectric conversion device according to claim 3, wherein the correction unit invalidates a digital value corresponding to the number of stages of the delay units through which the pulse signal has passed until a predetermined period has elapsed after the pixel signal has started to be read from the pixel array.

5. A photoelectric conversion device comprising:
a pixel array including a plurality of two-dimensionally arranged pixels, each of which has a photoelectric conversion element and outputs a pixel signal corresponding to an amount of light incident on the photoelectric conversion element; and
a plurality of analog-to-digital converters (ADCs), each of which converts the pixel signal read from the pixel array into a digital value and outputs the digital value,
wherein each ADC comprises:
 a pulse delay circuit including a plurality of connected delay unit stages, each of which delays a pulse signal during a delay time corresponding to a magnitude of a voltage of the pixel signal read from the pixel array;
 an encoder unit that outputs a digital value based on the number of stages of the delay units through which the pulse signal has passed during a predetermined time; and
 a correction unit that corrects the digital value output by the encoder unit by a rate corresponding to the number of stages of the delay units through which the pulse signal has passed during a predetermined period, and
wherein the correction unit comprises:
 a storage unit that stores a digital value corresponding to the number of stages of the delay units through which the pulse signal has passed until a predetermined period has elapsed after the pixel signal has started to be read from the pixel array; and
 a subtraction unit that subtracts the digital value stored by the storage unit from the digital value output from the encoder unit.

6. The photoelectric conversion device according to claim 5, wherein the correction unit invalidates a digital value corresponding to the number of stages of the delay units through which the pulse signal has passed until a predetermined period has elapsed after the pixel signal has started to be read from the pixel array.

* * * * *